(12) United States Patent
Yen

(10) Patent No.: US 7,781,126 B2
(45) Date of Patent: Aug. 24, 2010

(54) MASK AND PATTERN FORMING METHOD BY USING THE SAME

(75) Inventor: Yu-Lin Yen, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 903 days.

(21) Appl. No.: 11/223,480

(22) Filed: Sep. 8, 2005

(65) Prior Publication Data

US 2007/0054197 A1 Mar. 8, 2007

(51) Int. Cl.
*G03F 1/00* (2006.01)

(52) U.S. Cl. .......................................... 430/5; 430/311
(58) Field of Classification Search .................... 430/5, 430/311–313, 322

See application file for complete search history.

(56) References Cited

U.S. PATENT DOCUMENTS

| | | | | |
|---|---|---|---|---|
| 5,589,305 | A | * | 12/1996 | Tomofuji et al. ................ 430/5 |
| 5,811,208 | A | * | 9/1998 | Yokoyama et al. .............. 430/5 |
| 2001/0021477 | A1 | * | 9/2001 | Dirksen et al. .................. 430/5 |
| 2003/0091911 | A1 | * | 5/2003 | Noelscher ....................... 430/5 |
| 2003/0148635 | A1 | * | 8/2003 | Hasegawa et al. ........... 438/942 |

* cited by examiner

*Primary Examiner*—Mark F Huff
*Assistant Examiner*—Stewart A Fraser
(74) *Attorney, Agent, or Firm*—J.C. Patents

(57) ABSTRACT

The present invention provides a mask comprising a substrate, a plurality of strip patterns and at least an assist pattern. The strip patterns are disposed on the substrate and arranged in parallel to one another. The assist pattern is in a strip shape and disposed on the substrate. The assist pattern is arranged in parallel to and outside of the outermost strip pattern of the strip patterns. The assist pattern and the strip pattern have the same phase, while the assist pattern has a width larger than that of the strip patterns. When the mask is applied for exposure process, the pattern of the assist pattern will not be transferred to the underlying layer to be exposed.

6 Claims, 2 Drawing Sheets

MASK AND PATTERN FORMING METHOD BY USING THE SAME

BACKGROUND OF THE INVENTION

1. Field of Invention

The present invention relates to a mask and a method for forming patterns by using the same. More particularly, the present invention relates to a mask for improving proximity effects for the patterns and the pattern forming method by using the same.

2. Description of Related Art

In the conventional photolithography process, strip structures in parallel are in general formed by transferring strip patterns to the photoresist layer by using the mask having the strip patterns and then etching the underlying layer through the patterned photoresist layer. However, the outermost strip patterns of the patterns formed in the photoresist layer usually have problems of non-uniform aerial image and contrast or photoresist loss, thus causing undesirable impacts on the subsequently formed strip structures.

In order to solve the above problems, a dummy pattern is formed outside the outermost strip patterns of the patterns in the mask. When patterns are transferring to the photoresist layer, the proximity effects and photoresist loss occur in the dummy pattern. Therefore, the strip patterns between the outermost dummy patterns can be formed properly. Alternatively, a plurality of scattering bars is formed outside the outermost strip patterns of the patterns in the mask. Similarly, the outermost strip patterns can be free of proximity effects during the pattern transfer to the photoresist layer.

However, for the aforementioned method of forming dummy patterns in the mask, dummy patterns will be transferred to the photoresist layer or further to the wafers. Hence, the layout design of the wafer has to take the dummy patterns into consideration, which significantly reduces the workable area of the wafer.

For the method of using scattering bars, reliable strip patterns can be obtained by disposing additional scattering bars in the mask, which consumes much area of the mask and increases the layout budget of the mask. Moreover, certain issues such as non-uniform aerial image and contrast during defocus can not be improved by the use of scattering bars.

SUMMARY OF THE INVENTION

The present invention provides a mask and the pattern forming method by using the same, which can reduce the layout budget of the mask.

The present invention relates to a mask and the pattern forming method. By using such mask and such method, uniform aerial image and contrast can be obtained even under defocus situations.

The present invention relates to a mask and the pattern forming method, in which the design rule of the assist pattern(s) is simple.

The present invention relates to a mask and the pattern forming method. By using such mask and such method, no dummy patterns are formed and the workable area of the wafer is increased.

As embodied and broadly described herein, the present invention relates to a mask comprising a substrate, a plurality of strip patterns and at least an assist pattern. The strip patterns are disposed on the substrate and arranged in parallel to one another. The assist pattern is in a strip shape and disposed on the substrate. The assist pattern is arranged in parallel to and outside of the outermost strip pattern of the strip patterns. The assist pattern and the strip pattern have the same phase, while the assist pattern has a width larger than that of the strip patterns. When the mask is applied for exposure process, the pattern of the assist pattern will not be transferred to the underlying layer to be exposed.

As embodied and broadly described herein, the present invention relates a method for forming patterns, and the method comprises providing the aforementioned mask and performing an exposure step to an underlying layer of the wafer by using the mask, so that only the strip patterns of the mask are transferred to the underlying layer.

According to one embodiment, the strip patterns are made of a partially transparent material and have a 180-degree phase shift relative to the substrate.

According to one embodiment, the assist pattern is made of a transparent material.

According to one embodiment, one assist pattern is arranged outside of the outermost strip pattern at one side.

Because only one assist pattern is required for the outermost strip pattern at one side, thus reducing the layout budget of the mask.

The assist pattern has the same phase shift as the strip pattern and has a width larger than that of the strip pattern. Moreover, the pattern of the assist pattern will not be transferred to the underlying layer to be exposed. Therefore, uniform aerial image and contrast can be obtained even under defocus situations.

The design rule of the assist pattern(s) is simple and straightforward, because one assist pattern is arranged outside of the outermost strip pattern at one side.

Since patterns of the assist patterns will not be transferred as dummy patterns to the underlying layer to be exposed or the layer to be subsequently etched, the workable area of the wafer is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
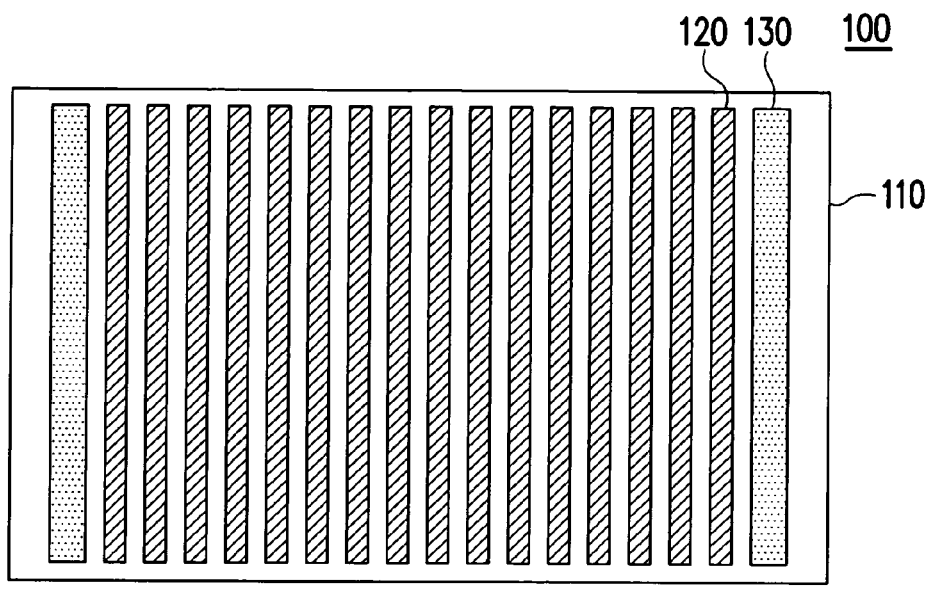
FIG. 1 is a cross-sectional view of a mask according to one preferred embodiment of this invention.

According to the preferred embodiments of this invention, different designs of the masks are described. FIG. 1 is a cross-sectional view of a mask according to one preferred embodiment. Referring to FIG. 1, the mask 100 includes at least a substrate 110, a plurality of strip patterns 120 disposed on the substrate 110 and at least an assist pattern 130 disposed on the substrate 110.

The substrate 110 is a transparent glass plate, transparent plastic plate or a plate made of a proper translucent material, for example.

The plurality of strip patterns 120 are arranged in parallel on the substrate 110. The strip patterns 120 are line and space patterns, for example. The strip patterns can be applied to form the word lines of the memory arrays, for example. In a preferred embodiment, the strip patterns are made of a partially transparent (translucent) material, having a 180-degree phase shift relative to the substrate 110 (considered as 0 degree), for example. The translucent material can be molybdenum silicide (MoSi) with a light transmission rate (transmittance) of 6%, for example.

The assist patterns 130 are in strip shapes and arranged in parallel to and outside of the outermost strip patterns 120. The width of one of the assist patterns 130 is larger than that of one of the strip patterns 120. The assist patterns 130 and the strip patterns 120 have the same phase. That is, the assist patterns 130 have a 180-degree phase shift relative to the substrate 110 if the strip patterns 120 have a 180-degree phase shift relative to the substrate 110. According to one preferred embodiment, the assist patterns 130 are made of a transparent material. When the mask 100 is applied to a layer of the wafer (not shown) to be exposed, the pattern of the assist pattern 130 will not be transferred to the layer; in another word, only the strip patterns 120 will be transferred to the layer. For the strip patterns 120 arranged in parallel, only one assist pattern 130 is arranged outside of each of the two outermost strip patterns, as shown in FIG. 1. Such arrangement is able to efficiently avoid proximity effects.

Figure 2:
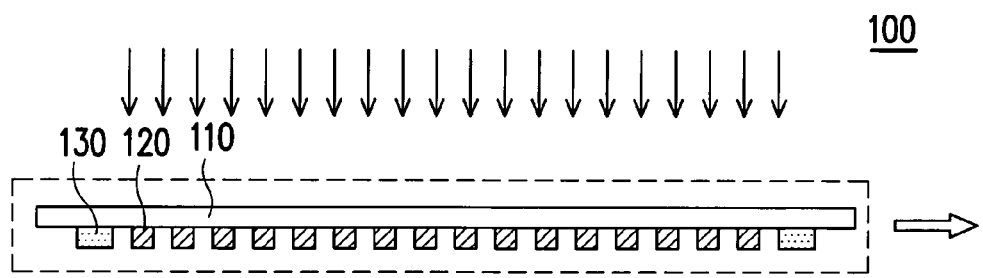
FIG. 2 is a display cross-sectional view of the exposure step of the pattern forming method by using the mask according to one preferred embodiment of this invention.
Figure 2:
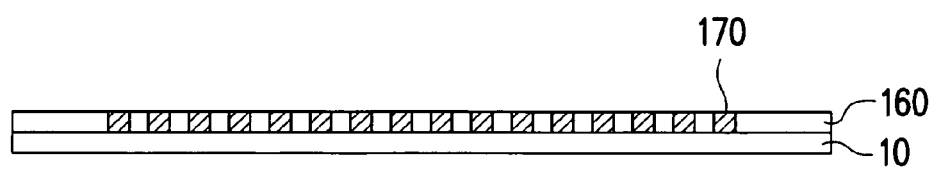

The aforementioned mask can be used to form desired patterns, as described in FIG. 2. The pattern forming method of this invention is to use the aforementioned mask 100 having the strip patterns 120 and the assist patterns 130 for exposure. Referring to FIG. 2, during exposure, patterns of the strip patterns 120 are transferred to the layer to be exposed 160 of the wafer 10, and a plurality of strip patterns 170 are formed in the layer 160. On the other hand, patterns of the assist patterns 130 are not transferred to the underlying layer to be exposed 160 because the assist patterns 130 are transparent. The layer to be exposed 160 can be a photoresist layer, for example. As understood, the exposure process is well known to one skilled in the art and will not be described in details herein.

Figure 3:
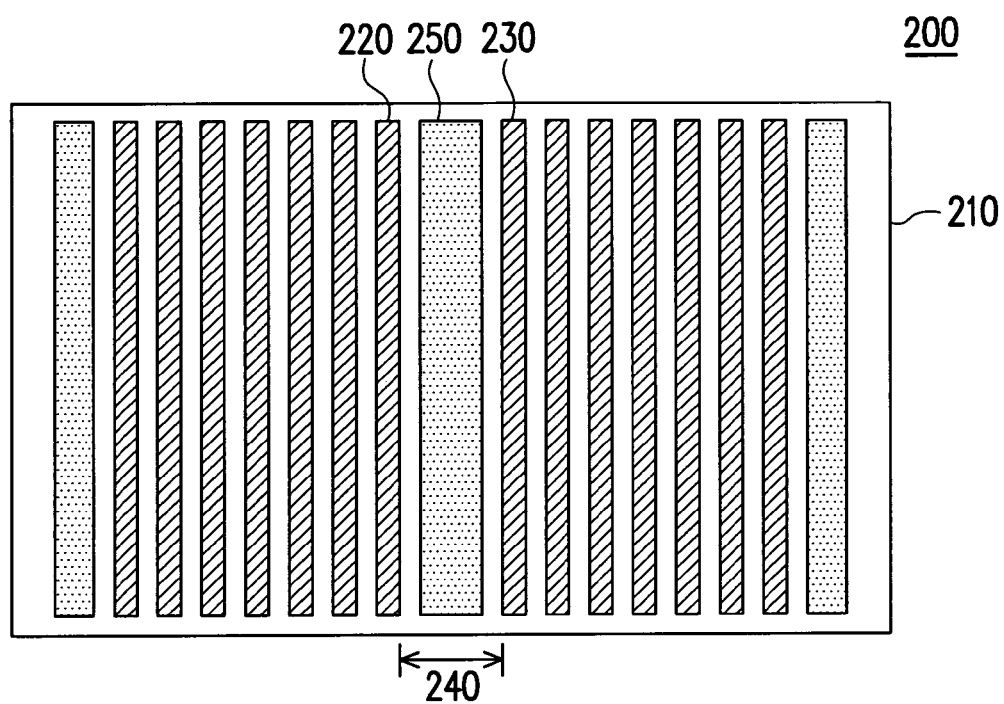
FIG. 3 is a cross-sectional view of a mask according to another preferred embodiment of this invention.

FIG. 3 is a cross-sectional view of a mask according to another preferred embodiment. Referring to FIG. 3, the mask 200 includes at least a substrate 210, a plurality of strip patterns 220, 230 disposed on the substrate 200 and at least an assist pattern 250 disposed on the substrate 200. The strip patterns 220, 230 are arranged in parallel and disposed on the substrate 210. The substrate 210, the strip patterns 220, 230, and the assist pattern(s) 250 are made of similar materials and have similar optical properties as described in the previous paragraphs. Referring to FIG. 3, the strip patterns 220 are arranged in parallel to the strip patterns 230 with a space 240 between the outermost strip pattern 220 and the outermost strip pattern 230 adjacent to the outermost strip pattern 220. The assist patterns 250 are arranged respectively outside the outermost strip patterns of the strip patterns 220 and 230. In this embodiment, because the space 240 is not larger enough, the assist pattern 250 disposed within the space 240 is shared by the strip patterns 220, 230.

In the conventional technology, because the space 240 between the strip patterns 220 and 230 is not larger enough, very limited amounts of scattering bars can be arranged within the space 240. Hence, the improvements provided by the scattering bars are limited. The transferred patterns of the outermost strip pattern 220 and the outermost strip pattern 230 adjacent to the outermost strip pattern 220 (with the space 240 in-between) may be impaired.

However, according to this invention, only one assist pattern 250 is arranged within the space 240 is able to ensure the formation of reliable transferred patterns for the outermost strip pattern 220, 230 with the space 240 in-between.

In conclusion, the present invention has the following advantages:

1. Only one assist pattern is required for the outermost strip pattern at one side, thus reducing the layout budget of the mask and increasing the design flexibility of the mask.

2. The assist pattern has the same phase shift as the strip pattern and has a width larger than that of the strip pattern. Moreover, the pattern of the assist pattern will not be transferred to the underlying layer to be exposed. Therefore, uniform aerial image and contrast can be obtained even under defocus situations.

3. The design of the assist pattern(s) is simple and straightforward, because one assist pattern is arranged outside the outermost strip pattern at one side.

4. Since the patterns of the assist patterns will not be transferred as dummy patterns to the underlying layer to be exposed or the layer to be subsequently etched, the workable area of the wafer is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A mask, comprising:
   a substrate,
   a plurality of strip patterns disposed on the substrate, wherein the strip patterns are line and space patterns being parallel to one another; and
   at least an assist pattern made of a transparent material disposed only on a portion of a periphery region adjacent to the strip patterns on the substrate, wherein the assist pattern is in a strip shape and arranged outside with a distance and in parallel to an outermost strip pattern of the strip patterns, the assist pattern has a same phase as the strip patterns and a width larger than that of the strip patterns, wherein as the mask is applied to a layer for exposure, only the strip patterns are transferred to the layer to form a plurality of word lines of memory arrays.

2. The mask of claim 1, wherein the strip pattern is made from a partially transparent material and has a 180-degree phase shift relative to the substrate.

3. The mask of claim 1, wherein one assist pattern is arranged outside of each of the two outermost strip patterns of the strip patterns.

4. A method for forming patterns, comprising:
   providing a mask, the mask comprising:
   a substrate,
   a plurality of strip patterns disposed on the substrate, wherein the strip patterns are line and space patterns being parallel to one another; and
   at least an assist pattern made of a transparent material disposed only on a portion of a periphery region adjacent to the strip patterns on the substrate, wherein the assist pattern is in a strip shape and arranged outside with a distance and in parallel to an outermost strip pattern of the strip patterns, the assist pattern has a same phase as the strip patterns and a width larger than that of the strip patterns; and
   performing an exposure step to an underlying layer by using the mask, so that only the strip patterns of the mask are transferred to the underlying layer to form a plurality of word lines of memory arrays.

5. The method of claim 4, wherein the strip pattern is made from a partially transparent material and has a 180-degree phase shift relative to the substrate.

6. The method of claim 4, wherein one assist pattern is arranged outside of each of the two outermost strip patterns of the strip patterns.

* * * * *